(12) United States Patent
Son et al.

(10) Patent No.: US 12,495,688 B2
(45) Date of Patent: Dec. 9, 2025

(54) DISPLAY DEVICE

(71) Applicant: Samsung Display Co., LTD., Yongin-si (KR)

(72) Inventors: Se Wan Son, Yongin-si (KR); Moo Soon Ko, Seoul (KR); Kyung Hyun Baek, Suwon-si (KR); Seok Je Seong, Seongnam-si (KR); Jae Hyun Lee, Seoul (KR); Jeong-Soo Lee, Hwaseong-si (KR); Ji Seon Lee, Hwaseong-si (KR); Yoon-Jong Cho, Seongnam-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/526,207

(22) Filed: Dec. 1, 2023

(65) Prior Publication Data

US 2024/0107840 A1 Mar. 28, 2024

Related U.S. Application Data

(63) Continuation of application No. 17/109,771, filed on Dec. 2, 2020, now Pat. No. 11,871,624.

(30) Foreign Application Priority Data

Feb. 25, 2020 (KR) .................. 10-2020-0022891

(51) Int. Cl.
*H10K 59/131* (2023.01)
*H10K 59/124* (2023.01)
(Continued)

(52) U.S. Cl.
CPC ......... *H10K 59/131* (2023.02); *H10K 59/124* (2023.02); *H10K 59/126* (2023.02); *G09G 3/32* (2013.01); *G09G 2300/0809* (2013.01)

(58) Field of Classification Search
CPC .. H01K 59/131; H01K 59/126; H01K 59/124; G09G 3/32; G09G 2300/0809
See application file for complete search history.

(56) References Cited

U.S. PATENT DOCUMENTS 9,601,518 B2 * 3/2017 Moon .................. H10D 86/60
10,121,415 B2 * 11/2018 Lee ...................... G09G 3/3233
(Continued)

FOREIGN PATENT DOCUMENTS

| JP | 3566516 | 9/2004 |
| KR | 10-2016-0091525 | 8/2016 |

(Continued)

OTHER PUBLICATIONS

English Translation of CN 108376694 (Year: 2018).*
English Translation of CN 108878476 (Year: 2018).

*Primary Examiner* — Patrick N Edouard
*Assistant Examiner* — Eboni N Giles
(74) *Attorney, Agent, or Firm* — Innovation Counsel LLP

(57) ABSTRACT

A display device includes a first semiconductor layer disposed on a substrate; a first insulating layer disposed on the first semiconductor layer; a scan line disposed on the first insulating layer; a second insulating layer on the scan line; an inverted scan line on the second insulating layer; a third insulating layer disposed on the inverted scan line; a second semiconductor layer disposed on the third insulating layer; a fourth insulating layer disposed on the second semiconductor layer; an initializing voltage line disposed on the fourth insulating layer and overlapping the scan line; a first transistor including a channel disposed in the first semiconductor layer and receiving a gate signal through the scan line; and a second transistor including a channel disposed in the second semiconductor layer and receiving a gate signal through the inverted scan line.

15 Claims, 7 Drawing Sheets

(51) Int. Cl.
*H10K 59/126* (2023.01)
*G09G 3/32* (2016.01)

(56) References Cited

U.S. PATENT DOCUMENTS

| | | | |
|---|---|---|---|
| 2014/0084293 A1 | 3/2014 | Ahn et al. | |
| 2018/0102400 A1 | 4/2018 | Choi et al. | |
| 2018/0158895 A1* | 6/2018 | Lee | H10K 59/124 |
| 2018/0286307 A1* | 10/2018 | Kim | G09G 3/3283 |
| 2018/0331171 A1* | 11/2018 | Kim | H10K 50/828 |
| 2019/0081259 A1 | 3/2019 | Mao | |
| 2021/0012082 A1* | 1/2021 | Uchida | A61B 5/1172 |

FOREIGN PATENT DOCUMENTS

| | | |
|---|---|---|
| KR | 10-2017-0031313 | 3/2017 |
| KR | 10-2018-0112193 | 10/2018 |

* cited by examiner

DISPLAY DEVICE

CROSS-REFERENCE TO RELATED APPLICATION(S)

This is a continuation application of U.S. patent application Ser. No. 17/109,771 filed Dec. 2, 2020 (now U.S. Pat. No. 11,871,624), the disclosure of which is incorporated herein by reference in its entirety. U.S. patent application Ser. No. 17/109,771 claims priority to and benefits of Korean Patent Application No. 10-2020-0022891 under 35 U.S.C. § 119, filed Feb. 25, 2020, in the Korean Intellectual Property Office (KIPO), the disclosure of which is incorporated herein by reference in its entirety for all purposes.

BACKGROUND

1. Technical Field

This disclosure relates to a display device, and, to a light emitting diode display device.

2. Description of the Related Art

A display device such as a light emitting diode display device may include a display panel in which pixels displaying an image may be arranged. Each pixel may include a light emitting diode and transistors and capacitors such that the light emitting diode may emit light with a predetermined luminance at a predetermined timing. Signal lines that may apply or may transmit a signal and/or a voltage to the pixels may be disposed on the display panel.

Image clarity and vividness may be a function of the resolution of the display device. The higher the resolution of the display device, the clearer and more vivid an image may be displayed. In order to increase the resolution, more pixels may generally need to be arranged in a limited area, as a result, a design that may increase a degree of integration of the pixels and the signal lines while not limiting other characteristics is required.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device that may prevent deterioration of image quality while increasing resolution.

An embodiment provides a display device that that my include a first semiconductor layer disposed on a substrate; a first insulating layer disposed on the first semiconductor layer; a scan line disposed on the first insulating layer; a second insulating layer disposed on the scan line; an inverted scan line disposed on the second insulating layer; a third insulating layer disposed on the inverted scan line; a second semiconductor layer disposed on the third insulating layer; a fourth insulating layer disposed on the second semiconductor layer; an initializing voltage line disposed on the fourth insulating layer and overlapping the scan line; a first transistor including a channel disposed in the first semiconductor layer, the first transistor receiving a gate signal through the scan line; and a second transistor including a channel disposed in the second semiconductor layer, the second transistor receiving a gate signal through the inverted scan line.

The initializing voltage line may extend in a first direction parallel to the scan line.

The display device may further include a data line extending in a second direction intersecting the first direction, and a shielding electrode electrically connected to the initializing voltage line and extending parallel to the data line.

The shielding electrode may overlap a gate electrode of the second transistor.

The display device may further include a fifth insulating layer disposed on the initializing voltage line, The data line and the shielding electrode may be disposed on the fifth insulating layer, and the shielding electrode may be electrically connected to the initializing voltage line through an opening of the fifth insulating layer.

The display device may further include a third transistor including a channel disposed in the first semiconductor layer, and a first connecting member electrically connecting a gate electrode of the third transistor and a drain electrode of the second transistor and disposed on the fifth insulating layer.

The first connecting member may not overlap the inverted scan line.

The display device may further include a fourth transistor including a channel disposed in the first semiconductor layer, and a second connecting member electrically connecting a drain electrode of the fourth transistor and the initializing voltage line. The shielding electrode may extend from the second connecting member.

The display device may further include an initializing control line disposed on the fourth insulating layer, and a fifth transistor including a channel disposed in the second semiconductor layer, the fifth transistor receiving a gate signal through the initializing control line. The shielding electrode may extend across the initializing control line.

The second transistor may include a lower gate electrode disposed between the second insulating layer and the third insulating layer, and an upper gate electrode disposed between the fourth insulating layer and the fifth insulating layer.

The upper gate electrode of the second transistor may be electrically connected to the lower gate electrode through an opening of the third insulating layer and the fourth insulating layer.

The display device may further include a sixth insulating layer disposed on the data line, and a data connecting line disposed on the sixth insulating layer and electrically connected to the data line through an opening of the sixth insulating layer.

An embodiment provides a display device that may include a scan line extending in a first direction; an inverted scan line extending in the first direction; an initializing control line disposed between the scan line and the inverted scan line and extending in the first direction; an initializing voltage line overlapping the scan line and extending in the first direction; a data line extending in a second direction intersecting the first direction; and a first shielding electrode electrically connected to the initializing voltage line and extending parallel to the data line across the initializing control line.

The first shielding electrode may extend to overlap the inverted scan line.

The display device may further include an insulating layer disposed between the initializing voltage line and the first shielding electrode. The first shielding electrode may be electrically connected to the initializing voltage line through an opening of the insulating layer. The display device may further include a first transistor including a gate electrode, wherein the gate electrode of the first transistor and the scan line may be disposed on a same layer, a second transistor receiving a gate signal through the scan line, a third transistor receiving a gate signal through the inverted scan line, and a first connecting member electrically connecting a drain electrode of the third transistor and the gate electrode of the first transistor, wherein the first connecting member may be disposed on the insulating layer.

The display device may further include a storage voltage line extending in the first direction. The first connecting member may be electrically connected to a drain electrode of the third transistor between the inverted scan line and the storage voltage line.

The display device may further include a fourth transistor including a gate electrode that may be a portion or an extension of the scan line, and a second connecting member electrically connecting a drain electrode of the fourth transistor and the initializing voltage line. The first shielding electrode may extend from the second connecting member.

The third transistor may include a lower gate electrode that may be a portion or an extension of the inverted scan line, and an upper gate electrode electrically connected to the lower gate electrode, wherein the upper gate electrode and the initializing voltage line may be disposed on a same layer.

The display device may further include a driving voltage line extending in the second direction, and a second shielding electrode electrically connected to the driving voltage line and adjacent to at least a portion of the gate electrode of the first transistor.

According to the display device of the embodiments, it may be possible to prevent deterioration of image quality while increasing resolution. In addition, the embodiments may provide recognizable effects throughout the specification.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
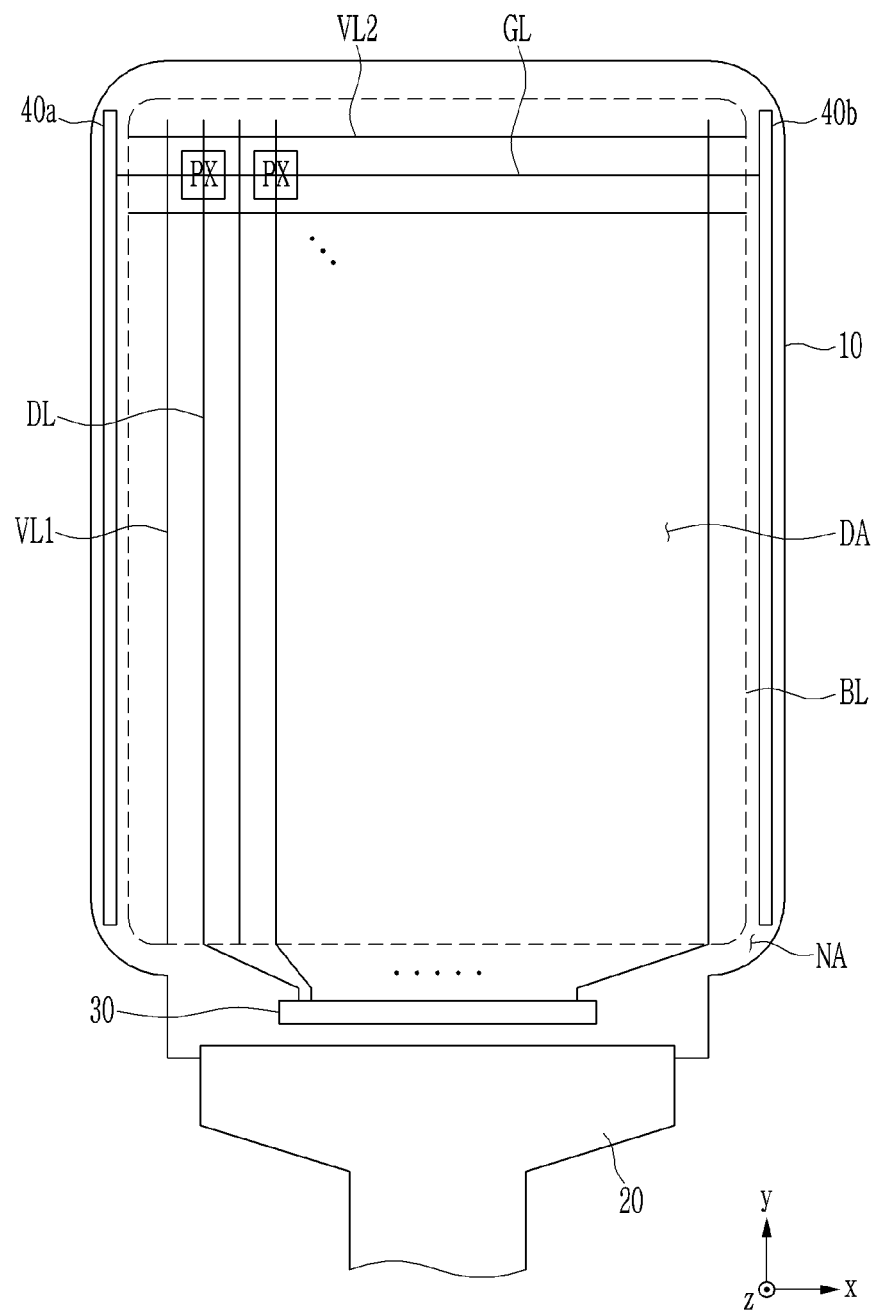
FIG. 1 illustrates a schematic view of a display device according to an embodiment.

The disclosure will be described more fully hereinafter with reference to the accompanying drawings, in which embodiments are shown.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

FIG. 1 schematically illustrates a top plan view of a display device according to an embodiment.

Referring to FIG. 1, the display device may include a display panel 10. The display panel 10 may include a display area DA that may display an image and a non-display area NA in which elements and/or signal lines that may generate and/or transmit various signals applied to the display area DA may be disposed, and the non-display area NA may surround or may be adjacent to the display area DA. The display area DA may be inside a boundary line BL illustrated by a dotted line, and the non-display area NA may be outside the boundary line BL. The display area DA may correspond to a screen.

In the display area DA of the display panel 10, pixels PX may be arranged or disposed in a matrix form, for example. Signal lines such as data lines DL and gate lines GL may also be disposed in the display area DA. The gate lines GL may substantially extend in a first direction x (for example, a row direction), and the data lines DL may substantially extend in a second direction y (for example, a column direction). The gate line GL and the data line DL may be electrically connected to each pixel PX to be able to receive a gate signal (also referred to as a scan signal) and a data voltage (also referred to as a data signal) from these signal lines. Driving voltage lines VL1 that may transmit a driving voltage ELVDD to the pixel PX may be disposed in the display area DA, and initializing voltage lines VL2 that may transmit an initializing voltage Vint to the pixel PX may be disposed. The driving voltage line VL1 may substantially extend in the second direction y. The initializing voltage line VL2 may substantially extend in the first direction x.

The display panel 10 may include a touch sensor layer in which touch electrodes may be arranged or disposed to sense a user's contact or non-contact touch. The touch electrodes may be mainly disposed in the display area DA. The display area DA may have a substantially quadrangular shape with rounded corners, but may have other shapes within the spirit and the scope of the disclosure.

A pad portion including pads that may receive a signal from the outside of the display panel 10 may be disposed in the non-display area NA of the display panel 10. The display device may include a flexible printed circuit film 20 having one or an end connected (for example, bonded) to the pad portion of the display panel 10. The other end of the flexible printed circuit film 20 may be electrically connected to a printed circuit board or the like to receive a signal such as image data, and to receive a power voltage such as the driving voltage ELVDD and a common voltage ELVSS.

A driving device that may generate and/or process various signals that may drive the display panel 10 may be disposed in the non-display area NA, or may be disposed in the flexible printed circuit film 20 connected or bonded to the pad portion. The driving device may control a data driver that may apply a data voltage to the data line DL, a gate driver that may apply a gate signal to the gate line GL, and a signal controller that may control the data driver, the scan driver, and the gate driver.

The gate driver may be integrated as driving circuits 40a and 40b in the non-display area NA of the display panel 10. The driving circuits 40a and 40b may include a driving circuit 40a disposed at one or a side of the display area DA and a driving circuit 40b disposed at the other or another side of the display area DA, and may be formed or disposed lengthwise in the second direction y. The driving circuits 40a and 40b may be electrically connected to the gate line GL. The driving circuits 40a and 40b may include a shift register including stages that may be dependently connected to each other, and each stage may include transistors and capacitors. Each stage may generate a gate signal.

The data driver and the signal controller may be provided as an integrated circuit chip 30. The integrated circuit chip 30 may be disposed in the non-display area NA of the display panel 10. The integrated circuit chip 30 may be disposed on the flexible printed circuit film 20. The data driver and the signal controller may be formed as one or a chip or may be formed as separate chips.

Figure 2:
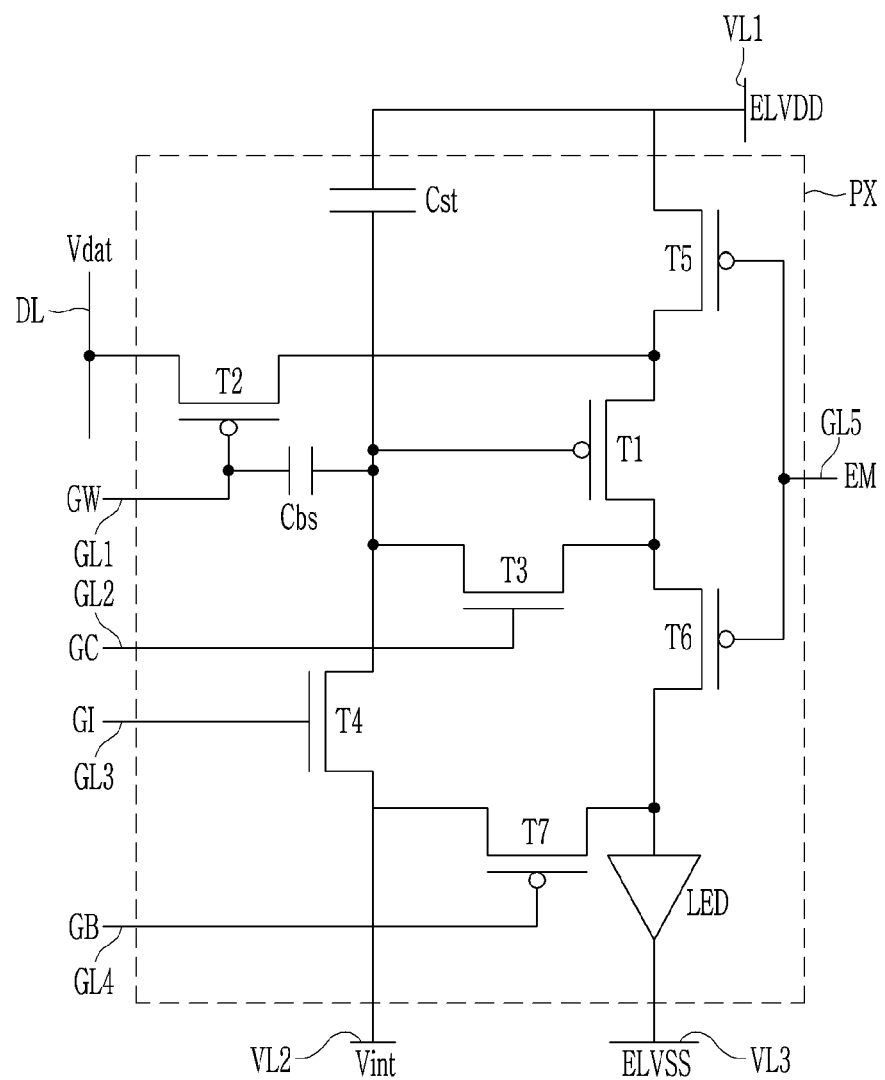
FIG. 2 illustrates an equivalent circuit diagram of a pixel of a display device according to an embodiment.

FIG. 2 illustrates an equivalent circuit diagram of one or a pixel PX of a display device according to an embodiment.

One or a pixel PX may include transistors T1 to T7, a storage capacitor Cst, a boost capacitor Cbs, and a light emitting diode LED electrically connected to several signal lines (GL1-GL5, DL, and VL1-VL3).

The signal lines (GL1-GL5, DL, and VL1-VL3) may include gate lines GL1 to GL5, a data line DL, and voltage lines VL1 to VL3. The gate lines GL1 to GL5 may be electrically connected to the gate driver, and the data line DL may be electrically connected to the data driver. The gate lines GL1 to GL5 may include a scan line GL1, an inverted scan line GL2, an initializing control line GL3, a bypass control line GL4, and a light emitting control line GL5. The voltage lines VL1 to VL3 may include a driving voltage line VL1, an initializing voltage line VL2, and a common voltage line VL3. The driving voltage line VL1, the initializing voltage line VL2, and the common voltage line VL3 may be respectively electrically connected to a voltage generator.

The second to seventh transistors T2 to T7 may receive respective gate signals through the gate lines GL1 to GL5.

The scan line GL1 may transmit a scan signal GW to the second transistor T2. The inverted scan line GL2 may transmit an inverted scan signal GC to the third transistor T3. The scan signal GW and the inverted scan signal GC may have opposite polarities. For example, when a high voltage is applied to the scan line GL1, a low voltage may be applied to the inverted scan line GL2.

The initializing control line GL3 may transmit an initializing control signal GI to the fourth transistor T4. The bypass control line GL4 may transmit a bypass signal GB to the seventh transistor T7. The bypass control line GL4 may be the scan line GL1 electrically connected to the pixel PX adjacent thereto in the second direction y. The light emitting control line GL5 may transmit a light emitting control signal EM to the fifth transistor T5 and the sixth transistor T6.

The data line DL may transmit a data voltage Vdat. The driving voltage line VL1 may transmit the driving voltage ELVDD, the initializing voltage line VL2 may transmit the initializing voltage Vint, and the common voltage line VL3 may transmit the common voltage ELVSS. Luminance of the light emitting diode LED may be adjusted according to the data voltage Vdat applied to the pixel PX. The driving voltage ELVDD, the initializing voltage Vint, and the common voltage ELVSS may be DC voltages each having a predetermined level.

Regarding the transistors T1 to T7, the first transistor T1, which may be a driving transistor, may be a p-type transistor and may include a polycrystalline semiconductor. The first transistor T1 may be a transistor that may control an amount of a driving current outputted to the anode of the light emitting diode LED according to the data voltage Vdat applied to a gate electrode of the first transistor T1. The gate electrode of the first transistor T1 may be electrically connected to a first electrode of the storage capacitor Cst. A source electrode of the first transistor T1 may be electrically connected to a drain electrode of the second transistor T2, and may be electrically connected to the driving voltage line VL1 via the fifth transistor T5. A drain electrode of the first transistor T1 may be electrically connected to the anode of the light emitting diode LED via the sixth transistor T6.

The second transistor T2, which may be a switching transistor, may be a p-type transistor and may include a polycrystalline semiconductor. A gate electrode of the second transistor T2 may be electrically connected to the scan line GL1, and may be electrically connected to a first electrode of the boost capacitor Cbs. A source electrode of the second transistor T2 may be electrically connected to the data line DL, and a drain electrode of the second transistor T2 may be electrically connected to the source electrode of the first transistor T1. When the second transistor T2 is turned on by a gate-on voltage (low voltage) of the scan signal GW transmitted through the scan line GL1, the data voltage Vdat transmitted through the data line DL may be transmitted to the source electrode of the first transistor T1.

The third transistor T3, which may be a compensation transistor, may be an n-type transistor, and may include an oxide semiconductor. The third transistor T3 may electrically connect the drain electrode and the gate electrode of the first transistor T1. As a result, the compensation voltage of which the data voltage Vdat may be changed through the first transistor T1 may be transmitted to the first electrode of the storage capacitor Cst. A gate electrode of the third transistor T3 may be electrically connected to the inverted scan line GL2, and a source electrode of the third transistor T3 may be electrically connected to the drain electrode of the first transistor T1. A drain electrode of the third transistor T3 may be electrically connected to the first electrode of the storage capacitor Cst, the gate electrode of the first transistor T1, and the second electrode of the boost capacitor Cbs. When the third transistor T3 is turned on by a gate-on voltage (high voltage) of the inverted scan signal GC received through the inverted scan line GL2, the third transistor T3 may electrically connect the gate electrode of the first transistor T1 and the drain electrode of the first transistor T1. The voltage applied to the gate electrode of the first transistor T1 may be stored in the storage capacitor Cst, and the storage capacitor Cst may maintain the voltage of the gate electrode of the first transistor T1 constant for one frame.

The fourth transistor T4, which may be an initializing transistor, may be a p-type transistor, and may include a polycrystalline semiconductor. A gate electrode of the fourth transistor T4 may be electrically connected to the initializing control line GL3. The fourth transistor T4 may initialize the gate electrode of the first transistor T1 and the first electrode of the storage capacitor Cst to an initializing voltage Vint. A gate electrode of the fourth transistor T4 may be electrically connected to the initializing control line GL3, and a source electrode of the fourth transistor T4 may be electrically connected to the initializing voltage line VL2. A drain electrode of the fourth transistor T4 may be electrically connected to the first electrode of the storage capacitor Cst, the gate electrode of the first transistor T1, and the second electrode of the boost capacitor Cbs. The fourth transistor T4 may be turned on by a gate-on voltage (high voltage) of the initializing control signal GI received through the initializing control line GL3, and may transmit the initializing voltage Vint to the gate electrode of the first transistor T1 and the first electrode of the storage capacitor Cst.

The fifth transistor T5, which may be an operation control transistor, may be a p-type transistor and may include a polycrystalline semiconductor. The fifth transistor T5 may transmit the driving voltage ELVDD to the first transistor T1. A gate electrode of the fifth transistor T5 may be electrically connected to the light emitting control line GL5, a source electrode of the fifth transistor T5 may be electrically connected to the driving voltage line VL1, and a drain electrode of the fifth transistor T5 may be electrically connected to the source electrode of the first transistor T1. The sixth transistor T6, which may be a light emitting control transistor, may be a p-type transistor and may include a polycrystalline semiconductor. The sixth transistor T6 may transmit a driving current outputted from the first transistor T1 to the light emitting diode LED. A gate electrode of the sixth transistor T6 may be electrically connected to the light emitting control line GL5, a source electrode of the sixth transistor T6 may be electrically connected to the drain electrode of the first transistor T1, and a drain electrode of the sixth transistor T6 may be electrically connected to the anode of the light emitting diode LED.

The seventh transistor T7, which may be a bypass transistor, may be a p-type transistor and may include a polycrystalline semiconductor. The seventh transistor T7 may initialize the anode of the light emitting diode LED. A gate electrode of the seventh transistor T7 may be electrically connected to the bypass control line GL4, a source electrode of the seventh transistor T7 may be electrically connected to the anode of the light emitting diode LED, and a drain electrode of the seventh transistor T7 may be electrically connected to the initializing voltage line VL2. When the seventh transistor T7 is turned on by a gate-on voltage (low voltage) of the bypass signal GB, the initializing voltage Vint may be applied to the anode of the light emitting diode LED.

A second electrode of the storage capacitor Cst may be electrically connected to the driving voltage line VL1. A cathode of the light emitting diode LED may be electrically connected to the common voltage line VL3 that may transmit the common voltage ELVSS.

As described above, the first transistor T1 may include the polycrystalline semiconductor, and the third transistor T3 and the fourth transistor T4 may include the oxide semiconductor. The second transistor T2, the fifth transistor T5, the sixth transistor T6, and the seventh transistor T7 may include the polycrystalline semiconductor. Therefore, the first transistor T1 may have high electron mobility, and may reduce leakage currents of the third transistor T3 and the fourth transistor T4. As such, since the third transistor T3 and the fourth transistor T4 may include a different semiconductor material from the first transistor T1, they may be stably driven, and reliability may be improved. At least one of the second transistor T2, the fifth transistor T5, the sixth transistor T6, and the seventh transistor T7 may include an oxide semiconductor. It is to be understood that the numbering of the transistors and the types and materials of the transistors may be variously modified without departing from the spirit and the scope of the disclosure.

When a high voltage is applied to the scan line GL1, a low voltage may be applied to the inverted scan line GL2, and when a low voltage is applied to the scan line GL1, a high voltage may be applied to the inverted scan line GL2. Since the inverted scan signal GC applied to the inverted scan line GL2 may be an inverted signal with respect to the scan signal GW applied to the scan line GL1, the gate voltage of the first transistor T1 may be decreased after the data voltage is written. In contrast, the scan signal GW may increase the gate voltage of the first transistor T1. Therefore, when a data voltage that may display black is written, the data voltage may decrease. When the boost capacitor Cbs is disposed between the scan line GL1 and the gate electrode of the first transistor T1, it may be possible to stably output a data voltage displaying black by increasing the gate voltage of the first transistor T1.

In an illustrated embodiment, the pixel PX may include the seven transistors T1 to T7, one or a storage capacitor Cst, and one or a boost capacitor Cbs, but the number of transistors and the number of capacitors, and their connection relationships, may be variously changed.

Figure 3:
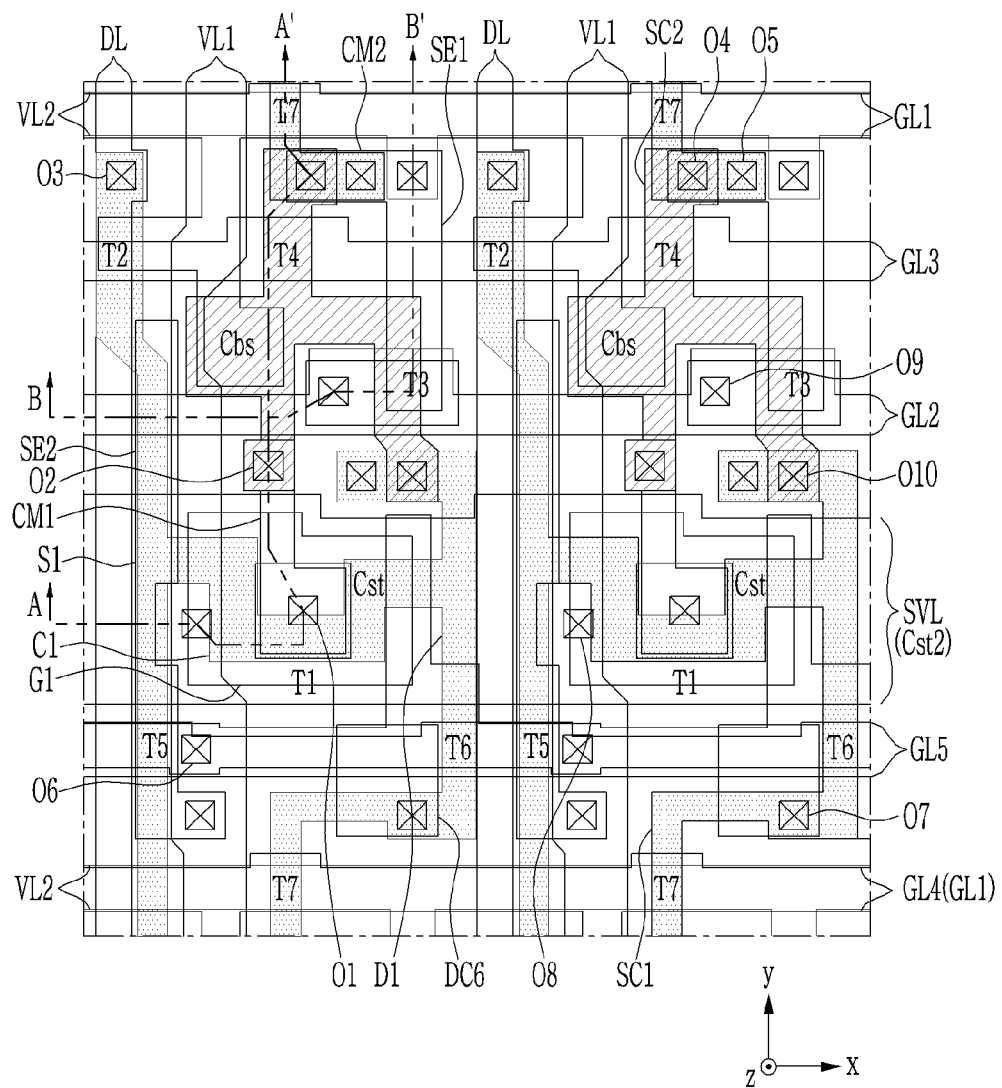
FIG. 3 illustrates a top plan view of a display device according to an embodiment.
Figure 4:
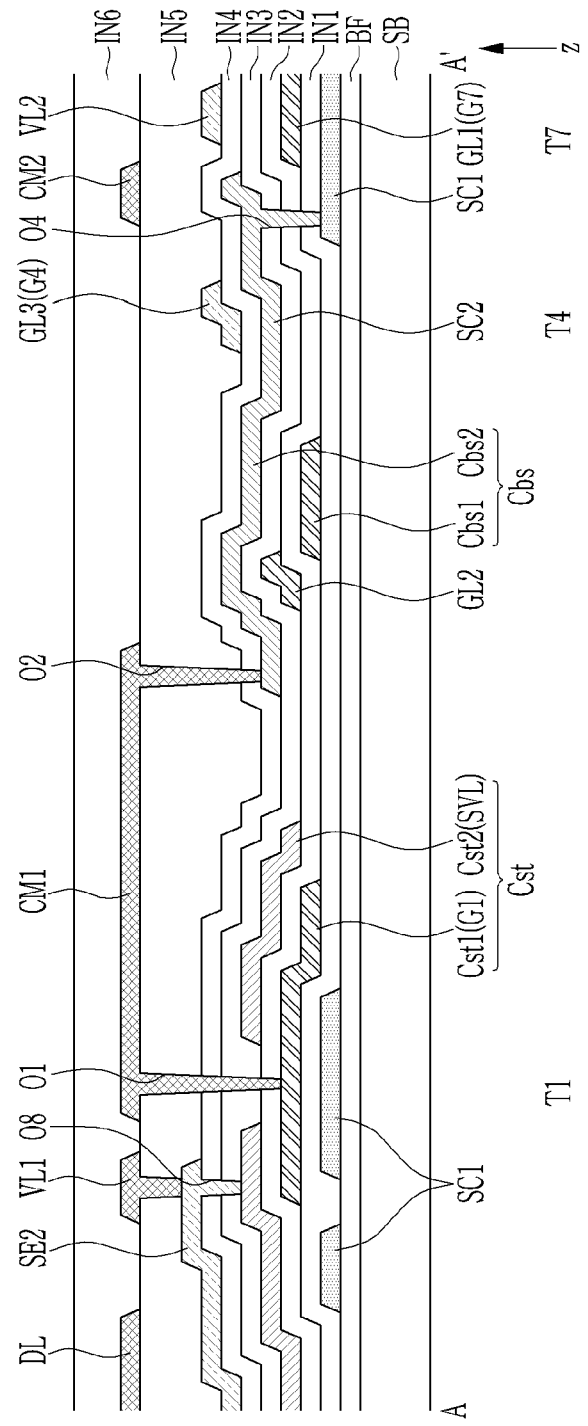
FIG. 4 illustrates a schematic cross-sectional view taken along line A-A' of FIG. 3.
Figure 5:
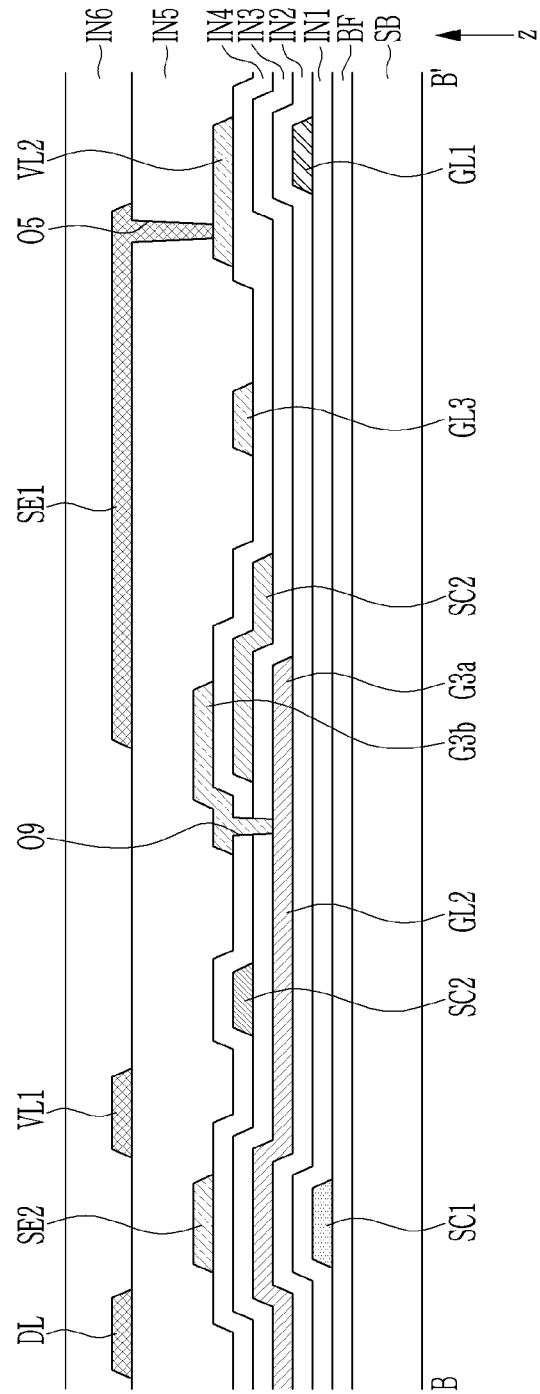
FIG. 5 illustrates a schematic cross-sectional view taken along line B-B' of FIG. 3.
Figure 6:
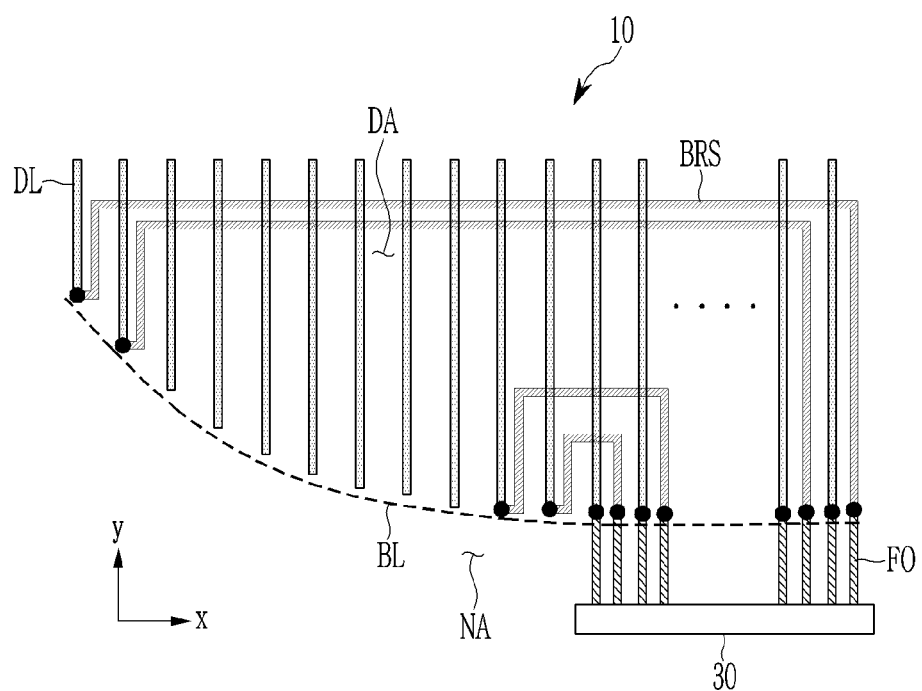
FIG. 6 illustrates a schematic view of an arrangement of data lines in a corner area of a screen in a display device according to an embodiment.

FIG. 3 illustrates a top plan view of a display device according to an embodiment, FIG. 4 illustrates a schematic cross-sectional view taken along line A-A' of FIG. 3, FIG. 5 illustrates a schematic cross-sectional view taken along line B-B' of FIG. 3, and FIG. 6 illustrates a schematic view of an arrangement of data lines in a corner area of a screen in a display device according to an embodiment.

FIG. 3 shows approximately two pixel areas adjacent in the first direction x. In order to avoid complexity of the drawing, the light emitting diode LED is not shown, and a stacked structure including the light emitting diode LED will be described later with reference to FIG. 7.

Referring to FIG. 3, the display may include the scan line GL1, the inverted scan line GL2, the initializing control line GL3, the bypass control line GL4, the light emission control line GL5, and the initializing voltage line VL2, substantially extending in the first direction x. The initializing voltage line VL2 may overlap the scan line GL1. The bypass control line GL4 may be substantially the same as the next scan line GL1. The display device may include the data line DL and the driving voltage line VL1 substantially extending in the second direction y.

The initializing voltage line VL2 may extend on the scan line GL1 in parallel to the scan line GL1. In order to prevent a short circuit between the initializing voltage line VL2 and the scan line GL1, at least one insulating layer may be disposed between the initializing voltage line VL2 and the scan line GL1. Since additional planar space for the initializing voltage line VL2 may be reduced by disposing the initializing voltage line VL2 as described above, the resolution of the display device may be increased. Since the initializing voltage line VL2 may block the scan line GL1, for example, coupling between the scan line GL1 and the data line DL may be reduced.

The display device may include the first to seventh transistors T1 to T7, the storage capacitor Cst, the boost capacitor Cbs, and the light emitting diode (not shown). The channel, the source electrode, and the drain electrode of each of the first, second, fifth, sixth, and seventh transistors T1, T2, T5, T6, and T7 may be disposed in the first semiconductor layer SC1 extending lengthwise. The first semiconductor layer SC1 may be bent in various shapes. The first semiconductor layer SC1 may include a polycrystalline semiconductor. The channel, the source electrode, and the drain electrode of each of the third transistor T3 and the fourth transistor T4 may be disposed on a second semiconductor layer SC2. In order to block a leakage current of the third transistor T3 and the fourth transistor T4, the second semiconductor layer SC2 may include an oxide semiconductor.

The semiconductor layers SC1 and SC2 may include a channel doped with n-type impurities or p-type impurities, and a source doped region and a drain doped region that may be disposed at opposite sides of the channel may have a higher doping concentration than that of the impurities doped in the channel. The source doped region and the drain doped region may correspond to the source and drain electrodes of each of the first to seventh transistors T1 to T7. A region between the source electrode and the drain electrode of different transistors in the semiconductor layers SC1 and SC2 may also be doped, thus the source electrode of one transistor and the drain electrode of the other transistor may be electrically connected.

The channel of each of the transistors T1 to T7 may overlap the gate electrode of each of the transistors T1 to T7, and may be disposed between the source electrode and the drain electrode of each of the transistors T1 to T7. The first, second, fifth, sixth, and seventh transistors T1, T2, T5, T6, and T7 may have substantially the same stacked structure. The third and fourth transistors T3 and T4 may have substantially the same stacked structure. The first transistor T1 will be mainly described, and the remaining transistors T2 to T7 will be briefly described.

The first transistor T1 may include a channel C1, a gate electrode G1, a source electrode S1, and a drain electrode D1. The channel C1 may overlap the gate electrode G1 between the source electrode S1 and the drain electrode D1. The gate electrode G1 may overlap the channel C1. The source electrode S1 and the drain electrode D1 may be adjacent to respective sides of the channel C1. A first connecting member CM1 may be electrically connected to the gate electrode G1 through an opening O1. For this connection, an opening through which the first connecting member CM1 may penetrate may be formed or disposed in a second electrode Cst2 of the storage capacitor Cst.

The gate electrode of the second transistor T2 may be an extension of the scan line GL1. The data line DL may be electrically connected to the source electrode of the second transistor T2 through an opening O3.

The (lower) gate electrode of the third transistor T3 may be a portion or an extension of the inverted scan line GL2. The source electrode of the third transistor T3 may be electrically connected to the drain electrode of the first transistor T1 and the source electrode of the sixth transistor T6 through an opening O10.

The gate electrode of the fourth transistor T4 may be a portion or extension of the initializing control line GL3. The source electrode of the fourth transistor T4 may be electrically connected to the drain electrode of the seventh transistor T7 through an opening O4. The drain electrode of the fourth transistor T4 and the drain electrode of the third transistor T3 may be electrically connected to the gate electrode G1 of the first transistor T1 through the first connecting member CM1.

The display device may include a first shielding electrode SE1 extending in a direction substantially parallel to the second direction y. The first shielding electrode SE1 may extend in parallel to the data line DL. The first shielding electrode SE1 may substantially extend to an area in which the third transistor T3 may be disposed. The first shielding electrode SE1 may extend to pass the initializing control line GL3 and may overlap the gate electrode of the third transistor T3. The first shielding electrode SE1 may be electrically connected to the initializing voltage line VL2 through an opening O5. The first shielding electrode SE1 may extend from a second connecting member CM2, and may be integrally formed with the second connecting member CM2. Since the first shielding electrode SE1 may be electrically connected to the initializing voltage line VL2, the initializing voltage Vint, which may be a constant voltage, may be applied to the first shielding electrode SE1.

The first shielding electrode SE1 may be disposed between the data line DL electrically connected to the second transistor T2 of a pixel adjacent thereto and the first connecting member CM1. As described later, the first shielding electrode SE1, the data line DL, and the first connecting member CM1 may be disposed on the same layer. Therefore, the first shielding electrode SE1 may reduce coupling between the first connecting member CM1 and the data line DL, and may prevent or may reduce the gate voltage of the first transistor T1 from being affected by the data voltage applied to other pixels. Accordingly, it may be possible to prevent deterioration of image quality, such as a flicker or spot, which may occur due to the coupling.

The gate electrode of the fifth transistor T5 may be a portion of the light emitting control line GL5. The driving voltage line VL1 may be electrically connected to the source electrode of the fifth transistor T5 through an opening O6. The gate electrode of the sixth transistor T6 may be a portion of the light emitting control line GL5. A drain connecting member DC6 may be electrically connected to the drain electrode of the sixth transistor T6 through an opening O7.

The gate electrode of the seventh transistor T7 may be a portion of the bypass control line GL4. The source electrode of the seventh transistor T7 may be electrically connected to the drain electrode of the sixth transistor T6. The drain electrode of the seventh transistor T7 may be electrically connected to the source electrode of the fourth transistor T4. The second connecting member CM2 electrically connected to the initializing voltage line VL2 may be electrically connected to the drain electrode of the seventh transistor T7 through the opening O5.

The storage capacitor Cst may include the first electrode Cst1 and the second electrode Cst2 overlapping each other with at least one insulating layer therebetween. The first electrode Cst1 may correspond to the gate electrode G1 of the first transistor T1, and the second electrode Cst2 may be a portion or an extension of a storage voltage line SVL. The first connecting member CM1 may be electrically connected to the first electrode Cst1 through the opening O1, and the first connecting member CM1 may be electrically connected to the drain electrode of the third transistor T3 and the drain electrode of the fourth transistor T4 through the opening O2. Therefore, the first electrode Cst1 may be electrically connected to the drain electrode of the third transistor T3 and the drain electrode of the fourth transistor T4 through the first connecting member CM1. The second shielding electrode SE2 electrically connected to the driving voltage line VL1 may be electrically connected to the second electrode Cst2 through an opening O8. The storage capacitor Cst may store an electric charge corresponding to a difference between the driving voltage ELVDD transmitted to the second electrode Cst2 through the driving voltage line VL1 and the gate voltage of the gate electrode G1 of the first transistor T1.

The second shielding electrode SE2 may be disposed to surround or be adjacent to at least a portion of the gate electrode G1 of the first transistor T1, and may be disposed to extend between the data line DL and the first connecting member CM1. Since the second shielding electrode SE2 may be electrically connected to the driving voltage line VL1, the driving voltage ELVDD, which may be a constant voltage, may be applied to the second shielding electrode SE2. Accordingly, the second shielding electrode SE2 may reduce the coupling between the gate electrode G1 and the first connecting member CM1 and other signal lines, and may prevent or reduce the gate voltage of the first transistor T1 from being affected by such coupling.

A portion expanding and extending from the scan line GL1 and the second semiconductor layer SC2 overlapping the portion may form a first electrode and a second electrode of the boost capacitor Cbs, respectively. The boost capacitor Cbs may be disposed between the scan line GL1 and the gate electrode G1 of the first transistor T1.

A sectional structure of the display device according to an embodiment will be described according to a stacked order thereof with reference to FIG. 3, FIG. 4, and FIG. 5.

A buffer layer BF may be disposed on a substrate SB, and the first semiconductor layer SC1 including the channels, the source electrodes, and the drain electrodes of the first, second, fifth, sixth, and seventh transistors T1, T2, T5, T6, and T7 may be disposed on the buffer layer BF.

A first insulating layer IN1 may be disposed on the first semiconductor layer SC1. A first conductive layer that may include the gate electrodes of the first, second, fifth, sixth, and seventh transistors T1, T2, T5, T6, and T7, the first electrode Cst1, the first electrode Cbs1 of the boost capacitor Cbs, the scan line GL1, and the light emitting control line GL5 may be disposed on the first insulating layer IN1. FIG. 4 and FIG. 5 show the gate electrodes G1 and G7 of the first and seventh transistors T1 and T7.

A second insulating layer IN2 may be disposed on the first conductive layer. A second conductive layer that may include the inverted scan line GL2, a lower gate electrode G3a of the third transistor T3, a storage voltage line SVL, and the second electrode Cst2 may be disposed on the second insulating layer IN2. The inverted scan line GL2 transmitting the gate signal to the third transistor T3 may be separated from the first connecting member CM1 by thicknesses of third, fourth, and fifth insulating layers IN3, IN4, and IN5 in the third direction z. Since a distance between the inverted scan line GL2 and the first connecting member CM1 may be increased by at least thicknesses of the third and fourth insulating layers IN3 and IN4 compared to a case in which the inverted scan line GL2 may be formed of the second conductive layer, the coupling between the inverted scan line GL2 and the first connecting member CM1 may be reduced.

A third insulating layer IN3 may be disposed on the second conductive layer. The second semiconductor layer SC2 including the channels, the source electrodes, and the drain electrodes of the third and fourth transistors T3 and T4 may be disposed on the third insulating layer IN3. The second semiconductor layer SC2 may include the second electrode Cbs2 of the boost capacitor Cbs.

A fourth insulating layer IN4 may be disposed on the second conductive layer. The third conductive layer that may include the initializing control line GL3, the gate electrode G4 of the fourth transistor T4, an upper gate electrode G3b of the third transistor T3, the initializing voltage line VL2, and the second shielding electrode SE2 may be disposed on the fourth insulating layer IN4. The upper gate electrode G3b may be electrically connected to the lower gate electrode G3a through an opening 09 of the third and fourth insulating layers IN3 and IN4. The initializing voltage line VL2 may be disposed to overlap the scan line GL1.

A fifth insulating layer IN5 may be disposed on the third conductive layer. A fourth conductive layer that may include the data line DL, the driving voltage line VL1, the first shielding electrode SE1, the first connecting member CM1, and the second connecting member CM2 may be disposed on the fifth insulating layer IN5. The first connecting member CM1 may electrically connect the gate electrode G1 of the first transistor T1 and the drain electrode of the fourth transistor T4 disposed in different layers through the openings 01 and 02 of the insulating layers.

Since the data line DL and the first connecting member CM1 may be disposed on the same layer, there may be a limitation in reducing coupling by increasing the distance between the data line DL and the first connecting member CM1. Since the first shielding electrode SE1 to which the initializing voltage Vint is applied may be disposed between the data line DL and the first connecting member CM1 on the same layer as the data line DL and the first connecting member CM1, the coupling between the data line DL and the first connecting member CM1 may be reduced.

A sixth insulating layer IN6 may be disposed on the fourth conductive layer.

Briefly describing a material of each layer, the substrate SB may include an insulating material such as a polymer such as polyimide or polyamide or glass, by way of non-limiting example. When the substrate SB includes a polymer layer, the substrate SB may include a barrier layer including an inorganic insulating material such as a silicon oxide ($SiO_x$) and a silicon nitride ($SiN_x$) to prevent penetration of moisture and the like into the display.

The first to fifth insulating layers IN1 to IN5 may include an inorganic insulating material such as a silicon oxide and a silicon nitride. The sixth insulating layer IN6 may include an organic insulating material. Alternatively, at least one of the first to fifth insulating layers IN1 to IN5 may include an organic insulating material, or the sixth insulating layer IN6 may include an inorganic insulating material.

The first to fourth data conductive layers may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta).

The first semiconductor layer SC1 may include a polycrystalline semiconductor such as polycrystalline silicon, and the second semiconductor layer SC2 may include an oxide semiconductor such as an indium-gallium-zinc oxide (IGZO).

FIG. 6 illustrates a schematic view of arrangement of data lines in a corner area of a screen in a display device according to an embodiment. The illustrated area may approximately correspond to a lower left corner area in FIG. 1.

Referring to FIG. 6, the display area DA may have a rounded corner, and correspondingly, a corner of the display panel 10 may be rounded. A fan-out wire FO may be electrically connected to the data line DL extending in the second direction y in the display area DA near the rounded corner through a data connecting line BRS disposed in the display area DA. When the data line DL and the fan-out wire FO are electrically connected as described above, since the fan-out wire FO may not need to be disposed in the non-display area NA near the rounded corner, it may be possible to reduce an edge area of the display panel 10 and a width of a bezel of the display device. The fan-out wire FO may be included in at least one of the first to third conductive layers described above.

The data connecting line BRS may be disposed on a different layer from the data line DL, for example, on the sixth insulating layer IN6. The data connecting line BRS may be electrically connected to the fan-out wire FO, and may include a first portion extending in the second direction y, a second portion extending from the first portion in a direction parallel to the first direction x, a third portion extending from the second portion in a direction (−y)

opposite to the second direction y, and a fourth portion extending from the third portion in a direction parallel to the first direction x and electrically connected to the data line DL. The second portion of the data connecting line BRS may extend in parallel to the scan line GL1 described above. Therefore, due to the coupling between the data connecting line BRS and the scan line GL1, the data voltage applied through the data connecting line BRS may be changed, thus deterioration in image quality such as oblique bruising may occur. As described above, since the initializing voltage line VL2 may be disposed on the scan line GL1 to overlap the scan line GL1, the initializing voltage line VL2 may be disposed between the scan line GL1 and the second portion of the data connecting line BRS to shield the scan line GL1. Therefore, the initializing voltage line VL2 may reduce or prevent the coupling between the scan line GL1 and the data connecting line BRS. Consequently, the application of a process and a mask to increase a distance between the scan line GL1 and the data connecting line BRS to reduce the coupling (for example, forming an additional insulating layer and conductive layer) may be omitted.

Figure 7:
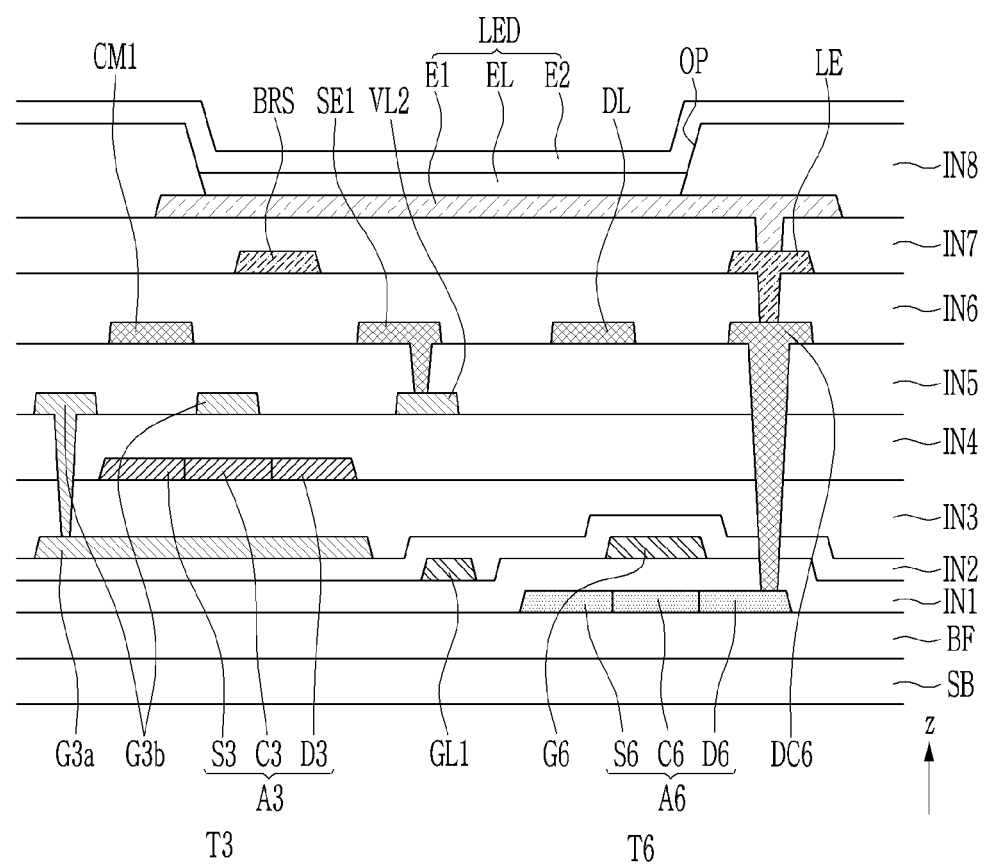
FIG. 7 illustrates a schematic cross-sectional view of a display device according to an embodiment.

FIG. 7 illustrates a schematic cross-sectional view of a display device according to an embodiment.

FIG. 7 illustrates substantially the same structure as the stacked structure of the display device described with reference to FIG. 4 and FIG. 5, but also illustrates the light emitting diode LED, the data connecting line BRS, and the like that may be disposed on the sixth insulating layer IN6. FIG. 7 schematically illustrates the third transistor T3 and the sixth transistor T6 and some or a predetermined number of signal lines among elements disposed between the substrate SB and the sixth insulating layer IN6.

Referring to FIG. 7, the buffer layer BF may be disposed on the substrate SB, and a semiconductor layer A6 of the sixth transistor T6 may be disposed on the buffer layer BF. The semiconductor layer A6 may include a channel C6, and a source electrode S6 and a drain electrode D6 of respective sides of the channel C6. The semiconductor layer A6 may be a portion of the first semiconductor layer SC1 described above, and may include a polycrystalline semiconductor.

The first insulating layer IN1 may be disposed on the semiconductor layer A6, and the first conductive layer including the gate electrode G6 of the sixth transistor T6 and the scan line GL1 may be disposed on the first insulating layer IN1. The first, second, fifth, and seventh transistors T1, T2, T5, and T7 (not shown) may have substantially the same stacked structure as that of the sixth transistor T6.

The second insulating layer IN2 may be disposed on the first conductive layer, and the second conductive layer including the lower gate electrode G3a of the third transistor T3 may be disposed on the second insulating layer IN2.

The third insulating layer IN3 may be disposed on the second conductive layer, and a semiconductor layer A3 of the third transistor T3 may be disposed on the third insulating layer IN3. The semiconductor layer A3 may include a channel C3, and a source electrode S3 and a drain electrode D3 on respective sides of the channel C3. The semiconductor layer A3 may be a portion of the second semiconductor layer SC2 described above, and may include an oxide semiconductor.

The fourth insulating layer IN4 may be disposed on the semiconductor layer A3, and the third conductive layer including the upper gate electrode G3b of the third transistor T3 and the initializing voltage line VL2 may be disposed on the fourth insulating layer IN4. The upper gate electrode G3b may be electrically connected to the lower gate electrode G3a through the opening of the third and fourth insulating layers IN3 and IN4. The third transistor T3 may have a double gate structure having the lower gate electrode G3a, which may be a portion or an extension of the inverted scan line GL2, and the upper gate electrode G3b electrically connected to the lower gate electrode G3a. The fourth transistor T4 (not shown) may have a structure that may be substantially the same as that of the third transistor T3, except that it may not include a configuration corresponding to the lower gate electrode G3a.

The fifth conductive layer IN5 may be disposed on the third conductive layer, and the fourth conductive layer including the first connecting member CM1, the first shielding electrode SE1, the data line DL, and the drain connecting member DC6 may be disposed on the fifth insulating layer IN5. The first shielding electrode SE1 may be electrically connected to the initializing voltage line VL2 through the opening of the fifth insulating layer IN5, and may be disposed between the data line DL and the first connecting member CM1 to reduce the coupling between the data line DL and the first connecting member CM1. In order to reduce coupling with the inverted scan line GL2, the first connecting member CM1 may be disposed to not overlap the inverted scan line GL2. In order to electrically connect the first connecting member CM1 to the drain electrode of the third transistor T3 and the drain electrode of the fourth transistor T4, the opening O2 formed in the fourth and fifth insulating layers IN4 and IN5 may be disposed between the inverted scan line GL2 and the storage voltage line SVL. The drain connecting member DC6 may be electrically connected to the drain electrode D6 through the opening of the first to fifth insulating layers IN1 to IN5.

The sixth insulating layer IN6 may be disposed on the fourth conductive layer, and the fifth conductive layer including a connecting electrode LE and the data connecting line BRS may be disposed on the sixth insulating layer IN6. The connecting electrode LE may be electrically connected to the drain connecting member DC6 through the opening of the sixth insulating layer IN6. The scan line GL1 may be shielded by the initializing voltage line VL2, thus the coupling between the data connecting line BRS and the scan line GL1 may be reduced.

A seventh insulating layer IN7 may be disposed on the fifth conductive layer, and a first electrode E1 of the light emitting diode LED may be disposed on the seventh insulating layer IN7. The first electrode E1 may be electrically connected to the connecting electrode LE through an opening of the seventh insulating layer IN7.

An eighth insulating layer IN8 provided with an opening OP overlapping the first electrode E1 may be disposed on the seventh insulating layer IN7. The seventh insulating layer IN7 and the eighth insulating layer IN8 may include an organic insulating material.

A light emitting layer EL of the light emitting diode LED may be disposed on the first electrode E1, and a second electrode E2 of the light emitting diode LED may be disposed on the light emitting layer EL. The second electrode E2 may be disposed across pixels.

The first electrode E1 may be an anode which is a hole injection electrode, and the second electrode E2 may be a cathode which may be an electron injection electrode. Holes and electrons may be injected into the light emitting layer from the first electrode E1 and the second electrode E2, respectively, and light may be emitted when excitons in which the injected holes and electrons may be combined enter a ground state from an excited state.

An encapsulation layer protecting the light emitting diode LED may be disposed on the second electrode E2. The encapsulation layer may have a structure in which an organic insulating layer may be disposed between inorganic insulating layers. A capping layer and/or a functional layer may be disposed between the second electrode E2 and the encapsulation layer.

The position and arrangement of the elements described above may be variously changed according to design.

While the disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
a first transistor including a first semiconductor layer;
a second transistor including a second semiconductor layer and electrically connected to the first transistor;
a first insulating layer disposed on the first semiconductor layer and the second semiconductor layer;
a first gate line disposed on the first insulating layer;
a second insulating layer disposed on the first gate line;
a second gate line disposed on the second insulating layer;
a third insulating layer disposed on the second gate line;
a third transistor including a third semiconductor layer disposed on the third insulating layer and electrically connected to the first transistor;
a fourth insulating layer disposed on the third semiconductor layer;
an initializing voltage line carrying an initializing control signal disposed on the fourth insulating layer;
a fifth insulating layer disposed on the initializing voltage line;
a data line carrying a data signal disposed on the fifth insulating layer;
a driving voltage line carrying a driving voltage disposed on the fifth insulating layer;
a shielding electrode electrically connected to the initializing voltage line and overlapping at least a portion of a channel of the third semiconductor layer, the shielding electrode and at least one of the data line and the driving voltage line being disposed on a same layer; and
a light emitting diode electrically connected to the first transistor.

2. The display device of claim 1, wherein
the first gate line extends in a first direction, and
the initializing voltage line extends in the first direction and overlaps the first gate line.

3. The display device of claim 1, wherein
the first gate line is electrically connected to a gate electrode of the second transistor, and
the second gate line is electrically connected to a gate electrode of the third transistor.

4. The display device of claim 1, wherein the shielding electrode overlaps a gate electrode of the third transistor.

5. The display device of claim 1, wherein
the initializing voltage line extends in a first direction, and
the shielding electrode extends in a second direction intersecting the first direction.

6. The display device of claim 5, further comprising:
a first connecting member disposed on the fifth insulating layer and electrically connecting a gate electrode of the third transistor and the third semiconductor layer, wherein
the data line extends in the second direction, and
the shielding electrode is disposed between the first connecting member and the data line in the first direction.

7. The display device of claim 6, wherein the first connecting member does not overlap the second gate line.

8. The display device of claim 6, further comprising:
a seventh transistor including a seventh semiconductor layer and electrically connected to the light emitting diode, and
a second connecting member disposed on the fifth insulating layer and electrically connecting the seventh semiconductor layer and the initializing voltage line,
wherein the shielding electrode extends from the second connecting member.

9. The display device of claim 8, wherein the shielding electrode is integral with the second connecting member.

10. The display device of claim 1, further comprising:
a fourth transistor including a fourth semiconductor layer disposed on the third insulating layer and electrically connected to the first transistor and the third transistor, and
a third gate line disposed on the fourth insulating layer and electrically connected to a gate electrode of the fourth transistor,
wherein the shielding electrode extends across the third gate line.

11. The display device of claim 1, wherein the third transistor includes:
a lower gate electrode disposed between the second insulating layer and the third insulating layer; and
an upper gate electrode disposed between the fourth insulating layer and the fifth insulating layer.

12. The display device of claim 11, wherein the upper gate electrode is electrically connected to the lower gate electrode through an opening of the third insulating layer and the fourth insulating layer.

13. The display device of claim 1, further comprising:
a sixth insulating layer disposed on the data line, and
a data connecting line disposed on the sixth insulating layer and electrically connected to the data line through an opening of the sixth insulating layer.

14. The display device of claim 13, wherein the shielding electrode and at least one of the data line and the driving voltage line are disposed between the fifth insulating layer and the sixth insulating layer.

15. The display device of claim 1, further comprising:
a second shielding electrode disposed between the fourth insulating layer and the fifth insulating layer and electrically connected to the driving voltage line.

* * * * *